United States Patent
Reynaud et al.

(10) Patent No.: US 9,453,871 B2
(45) Date of Patent: Sep. 27, 2016

(54) FAULT LOCATION ON A DE-ENERGIZED POWER LINE SECTION

(75) Inventors: Lionel Reynaud, Longueuil (CA); Daniel Pineau, Vercheres (CA)

(73) Assignee: HYDRO-QUEBEC, Montreal, Quebec (CA)

(*) Notice: Subject to any disclaimer, the term of this patent is extended or adjusted under 35 U.S.C. 154(b) by 757 days.

(21) Appl. No.: 13/811,430

(22) PCT Filed: Jul. 26, 2011

(86) PCT No.: PCT/CA2011/050455
§ 371 (c)(1),
(2), (4) Date: Jan. 22, 2013

(87) PCT Pub. No.: WO2012/012897
PCT Pub. Date: Feb. 2, 2012

(65) Prior Publication Data
US 2013/0124119 A1    May 16, 2013

(30) Foreign Application Priority Data
Jul. 28, 2010  (CA) ........................ 2711032

(51) Int. Cl.
*G01R 31/00* (2006.01)
*G01R 31/11* (2006.01)
*G01R 21/00* (2006.01)
*G01R 31/08* (2006.01)

(52) U.S. Cl.
CPC ............ *G01R 31/11* (2013.01); *G01R 31/086* (2013.01)

(58) Field of Classification Search
CPC ... G01R 31/11; G01R 31/086; G01R 31/021
See application file for complete search history.

(56) References Cited

U.S. PATENT DOCUMENTS

| | | | |
|---|---|---|---|
| 3,991,363 A | 11/1976 | Lathrop |
| 4,039,938 A | 8/1977 | Link |
| 4,952,880 A | 8/1990 | Clinton |
| 5,132,629 A | 7/1992 | Clinton et al. |
| 5,210,497 A | 5/1993 | Regini |

(Continued)

FOREIGN PATENT DOCUMENTS

| CA | 2 455 457 A1 | 11/2004 |
|---|---|---|
| CN | 101699540 A | 4/2010 |

(Continued)

OTHER PUBLICATIONS

Smail, M.K.,et al., "Detection of Defects in Wiring Networks Using Time Domain Reflectometry," IEEE Transactions on Magnetics, vol. 46, No. 8, pp. 2998-3001, Aug. 2010.

(Continued)

*Primary Examiner* — Phuong Huynh
(74) *Attorney, Agent, or Firm* — Muirhead and Saturnelli, LLC

(57) ABSTRACT

The locating of a fault on a de-energized power line section is carried out by measuring a reflection signal characterizing the fault and deriving from a voltage signal applied on the section. An application of the voltage signal and corresponding measurements of reflection signals are simulated with a model of the section for a fault located at different locations along the section. The simulated reflection signals are compared with the measured reflection signal. A location of the fault is located based on the location of the fault for the simulated reflection signal having a highest correlation with the measured reflection signal.

24 Claims, 10 Drawing Sheets

(56) References Cited

U.S. PATENT DOCUMENTS

| | | |
|---|---|---|
| 5,428,549 A | 6/1995 | Chen |
| 5,612,624 A | 3/1997 | Clinton |
| 5,661,664 A | 8/1997 | Novosel et al. |
| 5,726,574 A | 3/1998 | Silverberg et al. |
| 5,973,500 A | 10/1999 | Moreau et al. |
| 6,385,561 B1 | 5/2002 | Soraghan et al. |
| 6,448,781 B1 | 9/2002 | Frank et al. |
| 6,538,450 B2 | 3/2003 | Bussinger |
| 6,597,180 B1 | 7/2003 | Takaoka et al. |
| 6,683,459 B2 | 1/2004 | Dindis et al. |
| 7,282,922 B2 * | 10/2007 | Lo .......................... G01R 31/11 324/533 |
| 2004/0230387 A1 * | 11/2004 | Bechhoefer .......... G01R 31/311 705/58 |

FOREIGN PATENT DOCUMENTS

| | | |
|---|---|---|
| EP | 0163921 A1 | 12/1985 |
| FR | 2918784 A1 | 1/2009 |

OTHER PUBLICATIONS

Hizman, H., "Fault section identification and location on a distribution feeder using travelling waves," Power Engineering Society Summer Meeting, 2002 IEEE, vol. 3, pp. 1107-1112, Jul. 25, 2002.

* cited by examiner

FAULT LOCATION ON A DE-ENERGIZED POWER LINE SECTION

FIELD OF THE INVENTION

The invention generally relates to fault location on a power line, and more particularly to a method and a system for locating a fault on a de-energized power line section, for example of a distribution network line.

BACKGROUND

Locating faults in underground lines of a medium voltage distribution network consists in identifying, on a cable span or at the level of an accessory such as a junction, a location of a fault that caused a line in service to trip, or that prevents a line from maintaining a voltage during dielectric tests or other like tests such as by VLF ("Very Low Frequency").

A fault consists most of the time in an open circuit (severed neutral and/or conductor, improperly installed junction), a dead short (neutral and conductor in contact with each other, external conductor that gets across the cable or improperly installed junction), or an insulation fault.

Different techniques allow determining the location of a fault, usually reported in the form of a distance of the fault on the line from a measurement point. Confirmation of a fault and of its location on a span or a junction may be achieved in a visual or auditory way.

One of the location techniques among those most commonly used involves a reflectometer or an arc reflectometer. The principle of a reflectometer consists in sending a low voltage pulse on the line and to interpret a signal that comes back in response, using an echometer that displays the different reflections of the pulse in the signal according to a distance travelled over time. The time is proportional to the distance since the signal propagation speed is considered as constant. A fault appears as an abnormal discontinuity in the signal with respect to an echometry on a good phase of the same line. An arc reflectometer relies on the same basic principle, except that a high voltage pulse that creates an arc on the fault (a filter helps maintaining the arc) is first sent, followed after a delay by a low voltage pulse which bounces against this arc and which provides a reading of the echometry.

A reflectometer works well on short lines, from 0 to 800 m, not as well over longer distances. An arc reflectometer works on longer distances, up to a few kilometers. But in both cases, the readings are difficult to interpret (the farther the fault is, the less interpretable is the signal) and advanced know-how is required. Furthermore, the reflectometers quickly become inefficient when a line has branches, the multiple reflections being prone to "bury" the discontinuity caused by the fault, unless the fault is located before the branches.

One of the confirmation techniques among those most commonly used involves a pulse generator (called "thumper"). The generator is used to send a pulse of several kilovolts on a defective line put out of service. The voltage wave creates an electric arc at the level of the fault, between the neutral and the conductor. The fault acts as a spark gap. The electromagnetic waves generated by this breakdown may be monitored with ballistic tools and allow to get closer to the fault by moving along the line. However, this technique is not always very efficient. The sound emitted by the breakdown is generally audible to human ear. By moving along the line, a person may "listen" (by ear if the cables pass in underground conduits and structures, or with specialized amplification apparatuses) and identify the location of the fault.

A pulse generator is easy to use, but it is sometimes very difficult to hear the fault. Its repeated use (i.e. as long as the fault is not confirmed) tends to reduce the lifetime of the network components.

An underground distribution network generally comprises high density and low density load areas. In the high density areas, the lines often have several branches and are about 1 to 3 kilometers long. In the low density areas, the lines have few branches, but may be up to 15 kilometers long. In both cases, the reflectometers are difficult to use, require a lot of know-how and experience and are often inefficient. In both cases, the direct use of the pulse generator, without prior locating, involves a high number of pulses sent until confirmation of the fault, which adversely affect the equipments in the long term.

SUMMARY

An object of the present invention is to provide efficient locating method and system for lines that may be very long with or without branches.

Another object of the present invention is to provide such a method and system that reduce the risks of damaging the equipment on the lines.

Another object of the present invention is to provide such a method and system that are easy to use and require less know-how and experience than the usual techniques with reflectometers.

According to an aspect of the invention, there is provided a method for locating a fault on a de-energized power line section, comprising the steps of:
  applying a voltage signal on the power line section in order to produce a reflection signal on the power line section characterizing the fault;
  measuring the reflection signal on the power line section produced in response to the voltage signal;
  simulating, with a model of the power line section, an application of the voltage signal on the power line section and measurements of reflection signals produced in response to the voltage signal for a fault located at different locations along the power line section;
  comparing the reflection signals simulated for the fault located at different locations with the measured reflection signal; and
  indicating a location of the fault on the power line section based on the location of the fault for the simulated reflection signal having a highest correlation with the measured reflection signal.

According to another aspect of the invention, there is provided a system for locating a fault on a de-energized power line section, comprising:
  an interface that receives a measured reflection signal characterizing the fault and deriving from a voltage signal applied on the power line section;
  a simulation engine simulating, with a model of the power line section, an application of the voltage signal on the power line section and measurements of reflection signals produced in response to the voltage signal for a fault located at different locations along the power line section;
  a processor connecting to the interface; and a memory coupled to the processor, the memory storing instructions executable by the processor and that, when executed by the processor, cause the processor to:

compare the simulated reflection signals for the fault located at different locations with the measured reflection signal; and indicate a location of the fault on the power line section based on the location of the fault for the simulated reflection signal having a highest correlation with the measured reflection signal.

According to another aspect of the invention, there is provided a tangible and non-transitory computer program product for locating a fault on a de-energized power line section, containing instructions that, when executed by a processor, causes the processor to perform the steps of:

receiving a measured reflection signal characterizing the fault and deriving from a voltage signal applied on the power line section;

simulating, with a model of the power line section, an application of the voltage signal on the power line section and measurements of reflection signals produced in response to the voltage signal for a fault located at different locations along the power line section;

comparing the reflection signals simulated for the fault located at different locations with the measured reflection signal; and indicating a location of the fault on the power line section based on the location of the fault for the simulated reflection signal having a highest correlation with the measured reflection signal.

BRIEF DESCRIPTION OF THE DRAWINGS

A detailed description of preferred embodiments will be given herein below with reference to the following drawings.

DETAILED DESCRIPTION OF THE PREFERED EMBODIMENTS

Figure 1:
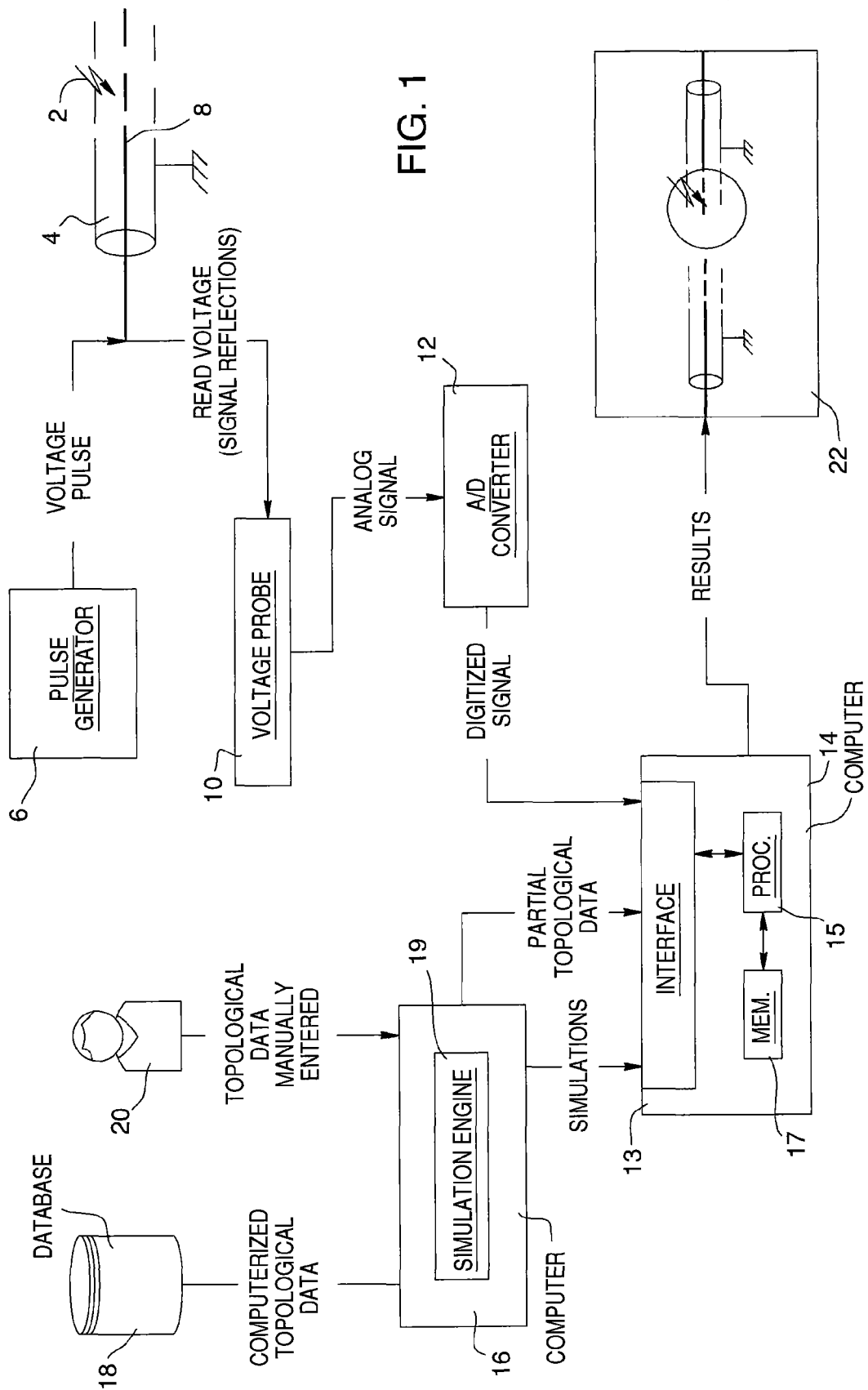
FIG. 1 is a schematic diagram illustrating a fault pre-locating system according to the invention.

Referring to FIG. 1, the locating method according to the invention relies on the following principles. The breakdown of a fault 2 on a phase 4 of a tested power line section produces a voltage wave that propagates and "bounces" at the ends of the line unceasingly until complete attenuation. From a voltage signal generator 6 (e.g. of pulses, of DC voltage or other if desired) connected to the conductor 8 of the phase 4 to be checked and used to produce a breakdown, an electric arc is seen as an end (low impedance circuit, a few Ohms). The lifetime of the electric arc is much longer than the period required for an observation of many goings and comings of the breakdown wave. A breakdown at a given location of a line section produces a signal which is unique and which may be modeled in order to simulate it.

Based on these principles, the method according to the invention in a way amounts to carry out the following steps:

simulating breakdowns at regular (or known) distance intervals on a line or line section to be checked, while observing the signal from a point where the voltage signal generator 6 is installed (or another point if desired);

measuring on the real line a real breakdown, at the point where the voltage signal generator 6 is installed (or another point if desired); and comparing the simulations with the measurement and identifying the simulation which best matches the measurement, the simulation corresponding to a unique point on the line and indicating a location of the fault.

The method applies in particular on a phase of a three-phase cable or on a single-phase cable. All the phases of the line to be tested are initially opened at the ends and not grounded.

The method applies to lines having a few hundreds of meters to several kilometers of cable. It allows locating faults even in the case where the line has branches of various lengths.

The method may also be applied to other types of electrical lines as a telephone line, terrestrial or not (e.g. in a boat, a plane, etc.).

A probe 10 of capacitive or other type is connected to the conductor 8 for measuring the signals produced in response to the voltage signal injected in the conductor 8. The probe 10 may be configured to allow having an attenuation of the signals for example of 2 000 to 20 000 times. Other types of probes may be used, provided that the amplitude of the signal that is inputted in an analog/digital converter 12 is compatible with the operational ranges of the converter 12.

In an underground network, the cable spans may be almost exclusively buried in conduits between two structures. When a span has a fault, it is usually necessary to extract it and replace it entirely. The required precision to locate the fault is in that case fairly low, since it is a matter of locating the fault between two access shafts that may be spaced apart by a few tens of meters to a few hundreds of meters.

In the case of cables directly buried in the ground, the required precision is much higher, e.g. 2 to 3 meters, since it is generally necessary to dig for repairing the cable.

The precision of the location will depend on the precision with which the simulation models are developed and the precision with which the simulations are performed.

The signals digitized by the converter 12 may be transmitted to a computer or electronic system in order to be processed according to the method of the invention. In the case of a computer system as illustrated in FIG. 1, the system may have a computer 14 that may be portable and having an interface 13 for receiving the digitized signals, a processor 15 connecting to the interface 13 and a memory 17 coupled to the processor 15. The computer 14 may be programmed to partially or fully execute the locating method of the invention. For example, the simulations may be carried out by the computer 14 or by a simulation engine 19 implemented by a distinct computer 16 likely to be more powerful and linked to a topological database 18 of the network from which the tested line section forms a part. The topological data of the network may be entered manually or not in the simulation computer 16 by an operator 20, the data being then storable in the database 18 if desired. The computer 14 may connect with the computer 16 via internet or another communication link, and may display the results of the fault locating on its screen as depicted by block 22. The computer 14 may also be in charge of performing the simulations and thus implementing the simulation engine 19 and be connectable to the database 18. Other system configurations are possible, for example without the computer 14, in which case the measured and digitized signals would then be transmitted to the computer 16.

Figure 2:
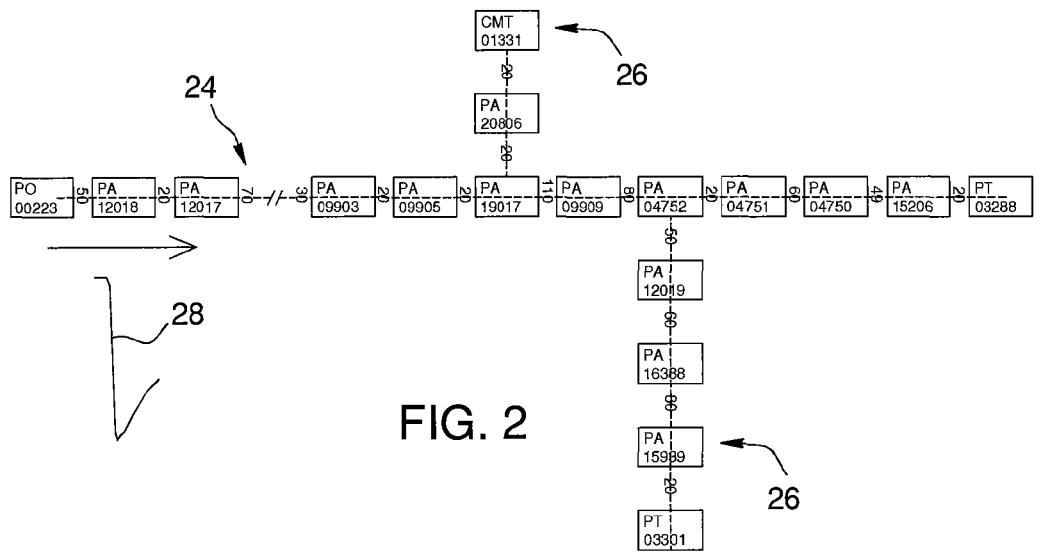
FIG. 2 is a schematic diagram illustrating a typical power line.

Referring to FIG. 2, the distribution lines are often made of a main line 24 to which one or several branches 26 connect (e.g. two are illustrated in FIG. 2).

When a pulse 28 (forming the voltage signal) is applied at the input of a line, the pulse 28 propagates and bounces on any impedance change. The significant reflections occur in particular at the ends of the line and at the branches. Reflections may also occur on line anomalies, for example on a point where the line would be damaged.

All these reflections may be visualized by a voltage or current measurement in different points of the line. It is especially practical to make it at the input of the line, at the same place where the pulse 28 is preferably injected. The pulse 28 may be injected in the line at another place if desired.

The voltage or current measurement in a given point of the line, in response to a voltage pulse, exhibits a graph which is specific and unique to the configuration of the line. In the following description, reference will be made only to a voltage measurement for simplification purposes. It should be understood that a current measurement may as well be used if desired. Likewise, reference will be made only to a pulse for simplification purposes. It should be understood that a different voltage signal may as well be used if desired.

The voltage measurement thus forms a "signature" of the line, of its particular character. It is the result of the addition over the time of the voltage variations, at a given point, of the different reflections appearing along the path of the line. This addition creates complex shapes.

Figure 3:
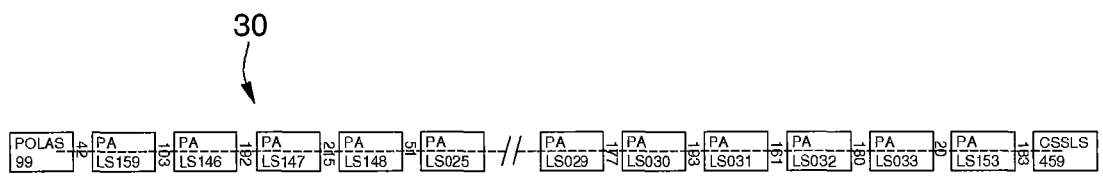
FIG. 3 is a schematic diagram illustrating a 2 265 m line section, without branches.

Referring to FIG. 3, there is shown a 2 265 meters long line section 30 without branches, used as an example for the following explanations.

When a pulse is applied with the generator 6 (shown in FIG. 1) on a line having a sparking fault, the results will be different depending on the applied voltages.

Figure 4:
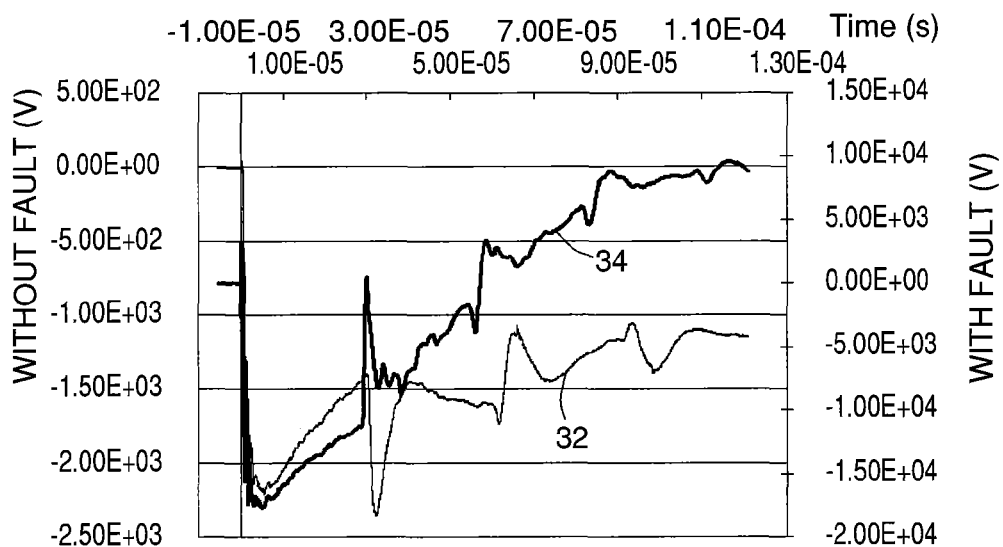
FIG. 4 is a graph illustrating examples of measured signatures of a line with and without a fault.

Referring to FIG. 4, if the voltage is low (typically 1 kV but which can for example vary in the order of 500 V to 4 kV depending on the case for medium voltage lines of 12 kV and 25 kV, phase-ground voltage), the fault will not produce an arc (no breakdown) and the line will behave most of the time as a good line. The signal measured in response to the low voltage pulse will then form a signature called line signature without a fault, as depicted by curve 32.

If the signature of a line in its normal state without a fault is known, the subsequent signatures, in the same measurement conditions, will be identical. The signature thus forms a stability test of the configuration or the state of the line.

When a line has been subjected to a sparking fault, a circuit breaker (not shown) has opened the circuit, because the current, when the arc appeared, has soared. To find the location where the arc occurs, it is thus useful to cause it using the pulse generator 6. When applying a high voltage pulse (typically 18 kV, but which can be adapted according to the type of network so as to cause the fault to breakdown while minimizing the risks of damaging the cables), it is possible to take a voltage measurement at the input of the line, at the same place where the voltage is injected with the generator 6. This measurement forms the signature of the line with a fault, as depicted by curve 34. The measurement may be taken elsewhere on the line if desired.

Comparing a signature without a fault and a signature with a fault highlights an alteration of the line characteristics.

It is possible, using a simulation engine 19 (shown in FIG. 1), to compute all the reflections that would occur in a cable subjected to pulses and to preview the behavior of the voltage and the current at any point of the line.

Figure 5A:
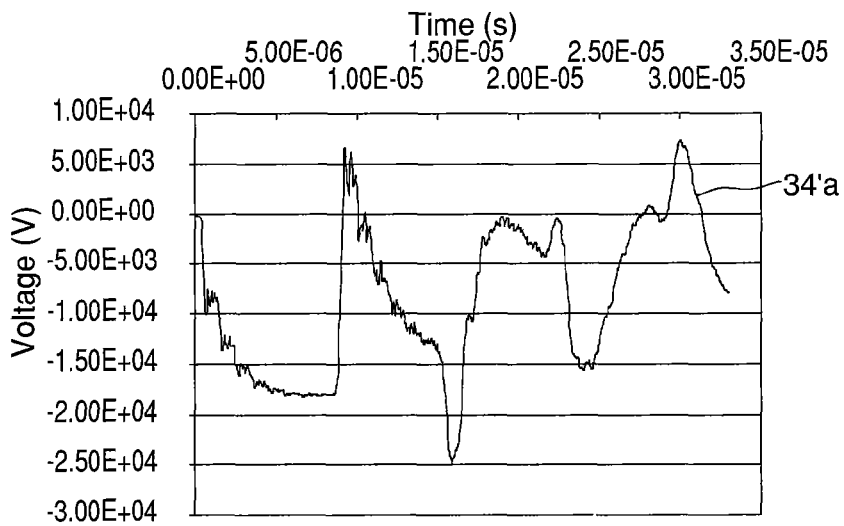
FIGS. 5A, 5B and 5C are graphs illustrating examples of simulated signatures with a fault at 500, 1 000 and 2 000 m.
Figure 5B:
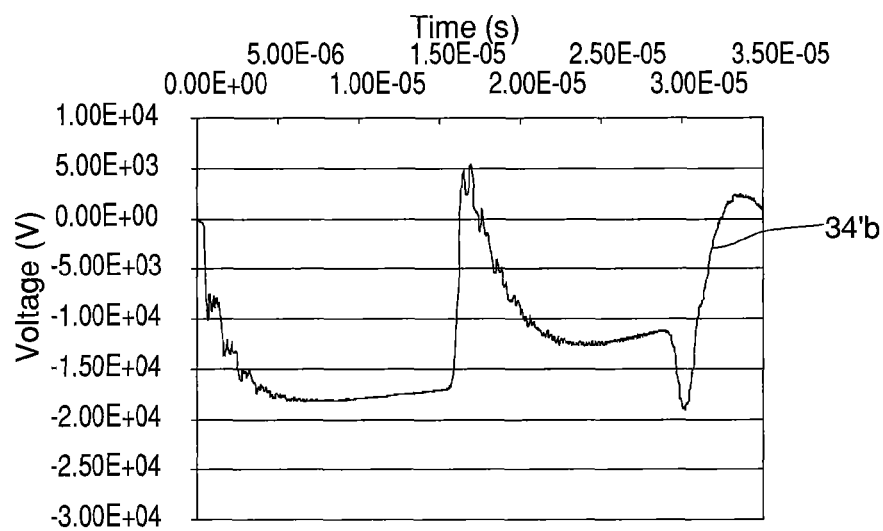
Figure 5C:
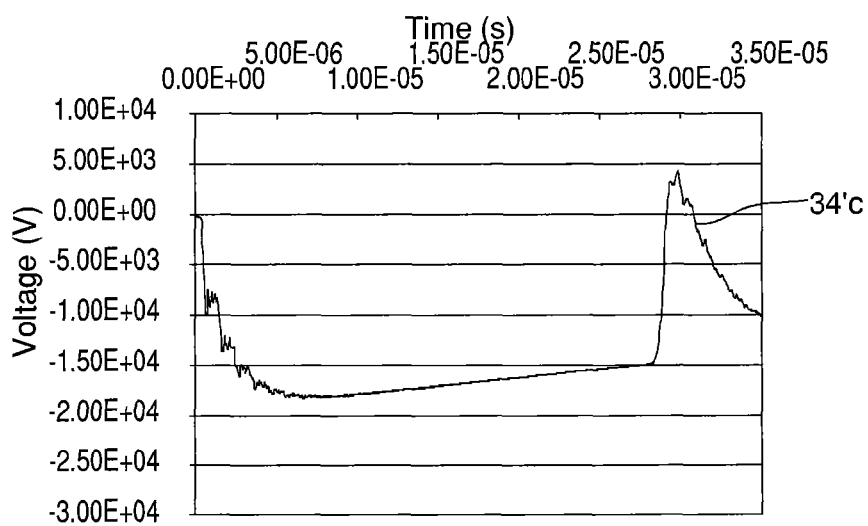

In the method of the invention, this is the simulation of the signature of the line without a fault (which would look like curve 32 in FIG. 4), and the simulation of the signatures of the line with a fault, while setting the fault at different locations all along the line as shown by curves 34'a, 34'b and 34'c shown in FIGs. 5A, 5B and 5C for respective distances of 500 m, 1 000 m and 2 000 m from the beginning of the line.

The simulations are possible as long as the models used by the simulator are realistic. The simulation engine 19 computes the variations of the voltage and current as function of the elements of the model. The higher the desired precision is, the more the model has elements and the more the simulation is heavy and requires computation time.

A compromise between the precision and the computation time may be made. The quality of the models may become particularly important. The more elaborated the model is, the more the results are precise. But in that case, the model has more elements, which involves more computation time. Compromises must thus be made as function of the expected results.

A model may be used for each type of cable, for the pulse generator 6 and for the sparking fault 2. Simulations at each interval of 20 m and at each structure or end of the line may be carried out. Other intervals may be chosen if desired.

When a simulation is achieved, a signal propagation time that depends on the models is obtained. But the reality may be slightly different from the models and the mean propagation time may be more or less higher in reality than in the simulations. To compensate for this possible "reality/simulation" difference, a step that may be initially performed during a locating with the method, is to compare a measurement of a signature without a fault with a simulation of a signature without a fault.

A coefficient of time correction Cct deriving from the difference between the speeds/propagation times of the signals travelling on the power line section and the simulated signals is determined. But digitally correcting all the simulations with respect to a measurement may be too expensive in computation time. The reverse may then be achieved so that each measurement (i.e. measured reflection signal) is corrected with respect to the simulations (i.e. corresponding simulated reflection signals).

To find the coefficient of correction, the following steps may be carried out:
varying the time period Δt of a measured signal (which amounts to compressing or extending the measured signal over a time scale) by digital processing;
computing a coefficient of correlation between the modified measured signal and a simulated signal, the correlation being preferably made by aligning voltage leading edges at the departure of both signals;
a Δt that gives a highest coefficient of correlation between both signals is kept, which means that both signals look the most alike;
computing the coefficient of time correction $$Cct = \frac{\Delta ts}{\Delta tm}$$

where Δts represents the time period of the simulated signal and Δtm represents the time period of the measured signal that provides the best correlation between both signals.

The Δt of any measurement may then be multiplied by Cct before comparing the measurement signal with the simulations.

Figure 6:
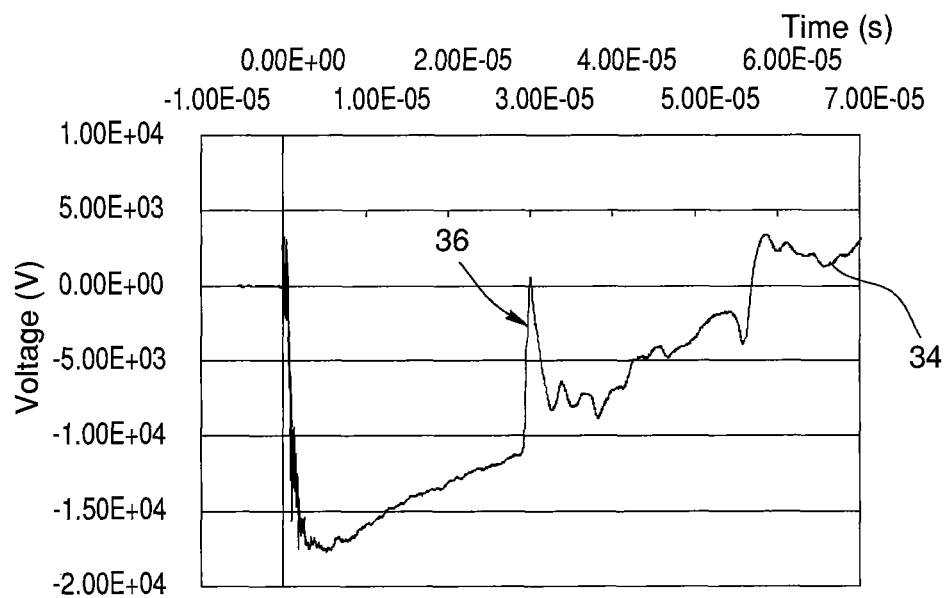
FIG. 6 is a graph illustrating a breakdown leading edge in a measured signature.

Referring to FIG. 6, to locate the fault, the simulations of the line with a fault are compared with the signal measurement during the surge pulse. If an ideal case is taken, the fault appears on the line as a fairly distinct leading edge 36. In FIG. 6, the leading edge 36 occurs around 2.2 km of distance. But in the majority of the cases, this distance is not that of the fault on the line. The time taken by the sparking fault to charge in voltage before sparking causes a right shift of the leading edge. For example, in the case of a cable having a propagation speed of 150 m per microsecond, a delay of 5 microseconds before the sparking causes the leading edge to appear 750 m farther than the real fault.

Because of the possible delay of the breakdown, the beginning of the first leading edge 36 is determined and the measurement and the simulations are preferably compared only from the beginning of this leading edge 36. The position of the leading edge 36 may be determined by digital processing of the measurements of the signature without a fault and of the signature with a fault.

All the signals are preferably filtered before their processing by a band pass filter that may be implemented in the computer 14 (shown in FIG. 1), generally between 100 kHz and 5 MHz. In this way, the signals are more uniform. The important variations are kept whereas the low frequency medium level provides no useful information.

Figure 7:
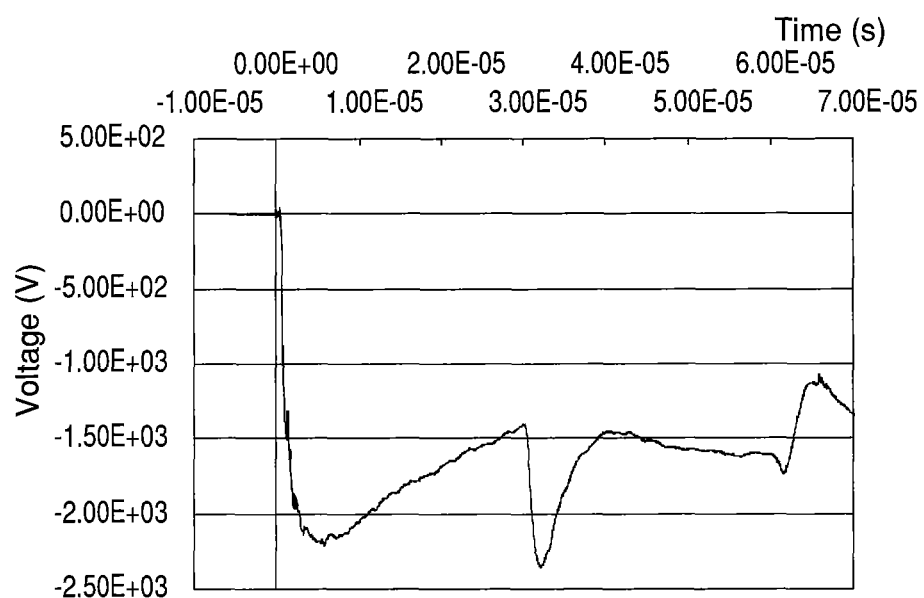
FIGS. 7 and 8 are graphs illustrating an unfiltered measured signature immediately after its sampling, and the same filtered signature, for a line without a fault.
Figure 8:
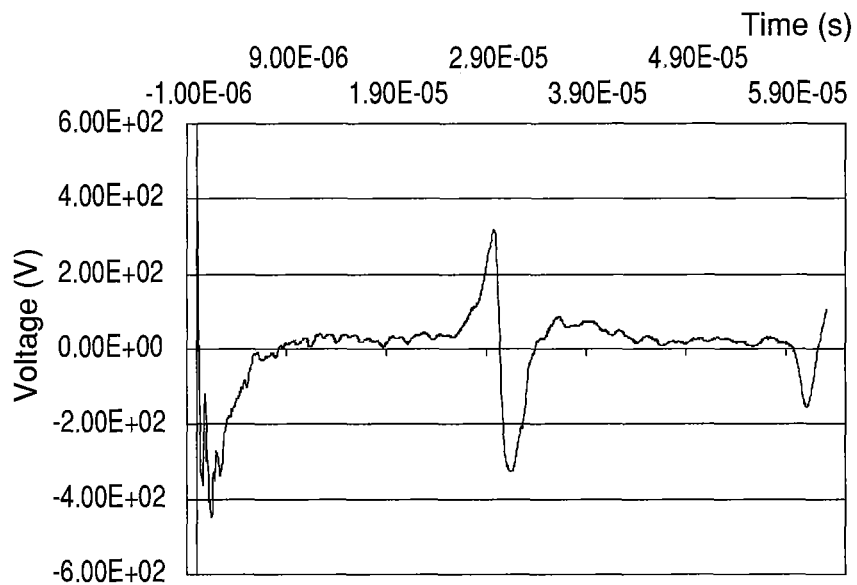

FIG. 7 represents an unfiltered signature, immediately after its sampling, while FIG. 8 represents the same signature once filtered.

Figure 9:
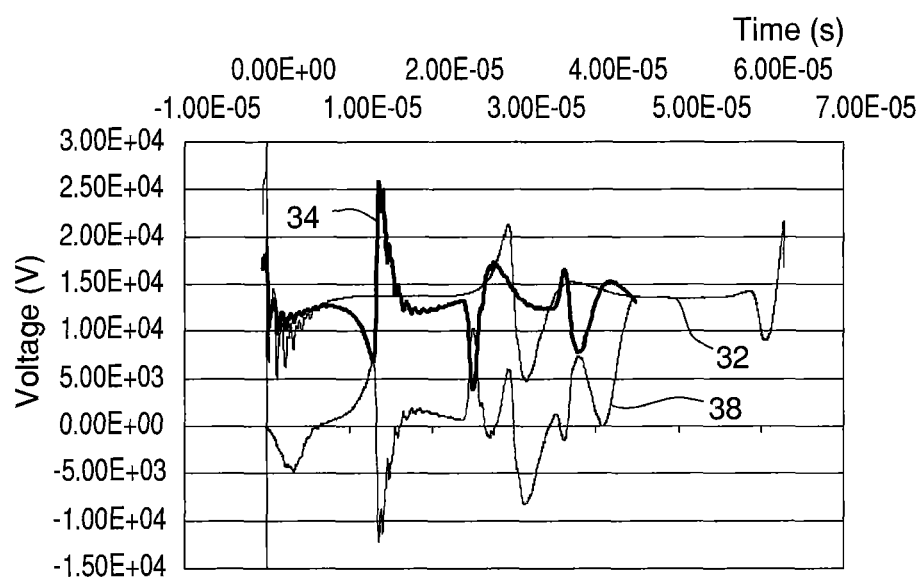
FIG. 9 is a graph illustrating a curve of the difference between a signature measured without a fault and a signature measured with a fault.

To find the breakdown leading edge, the difference between the signature measured without a fault 32 and the signature measured with a fault 34 may be carried out. Other processings may previously be applied on the signals by the computer 14 (shown in FIG. 1), such as a windowing that allows attenuating the importance of the beginning and the end of the signal. FIG. 9 shows an example of a curve 38 resulting from the difference between the signatures measured with and without a fault 34, 32.

Figure 10:
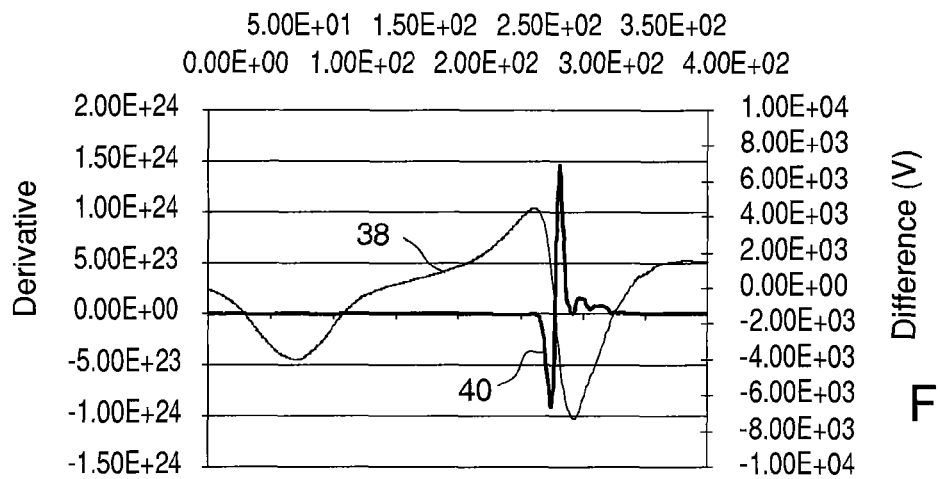
FIG. 10 is a graph illustrating a signal corresponding to the curve of slopes in every point of the curve of difference.

The curve of the slopes in every point of the curve of difference 38 may then be determined, which amounts to determining its derivative. FIG. 10 illustrates the resulting signal 40.

The first peak above a threshold which is set for example by default to 70% of the maximum amplitude is then searched in the derivative of the difference 40. The threshold of 70% may have been determined after trial and errors as being the threshold allowing detecting with most certainty the first leading edge of the breakdown while avoiding detecting leading edges caused by interferences or impedance changes on the path of the line. The threshold value may be different if desired, depending on the circumstances.

The position of the first leading edge corresponds to the beginning of the first leading edge of the breakdown in the measurement signal of the signature with a fault.

Figure 11:
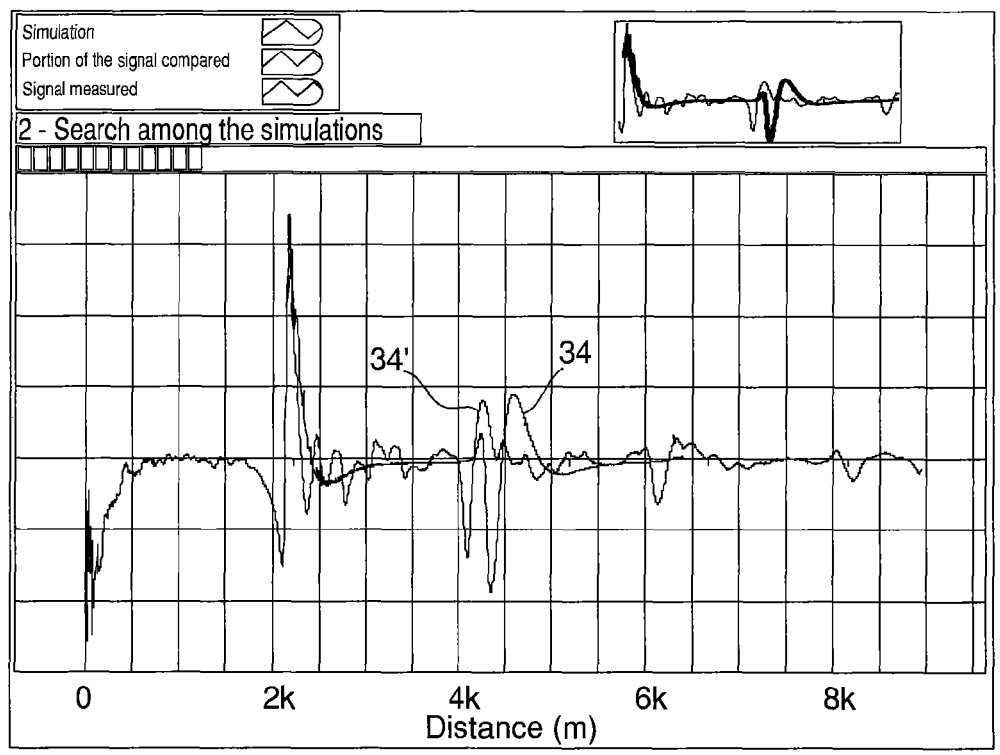
FIG. 11 is a schematic diagram illustrating an interface of the system used to compare a simulation with a signature measured with a fault, taking into account a position of a first breakdown leading edge

Referring to FIG. 11, the position of the first leading edge of the breakdown being identified, it is now possible to compare the measurement of the signature with a fault 34 to the simulations 34'.

Figure 12:
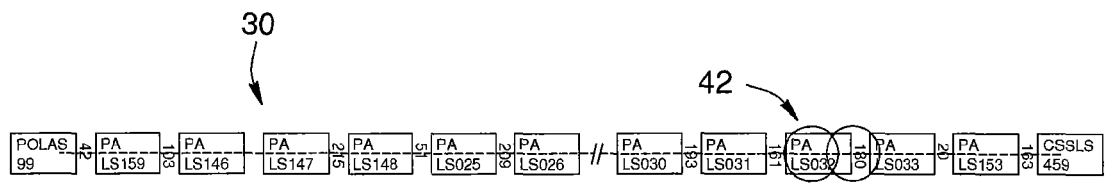
FIG. 12 is a schematic diagram illustrating an identification of possible locations of the fault on a map of a line.

Each simulation 34' is compared with the measured signal of the signature with a fault 34. The result of this comparison is a similarity coefficient whose maximum is reached when both signals look perfectly alike. The simulation that yields the highest similarity coefficient indicates the location of the fault. This simulation corresponds to a precise point 42 of the line which is easy to identify on the map of the line 30, as illustrated in FIG. 12.

Figure 13A:
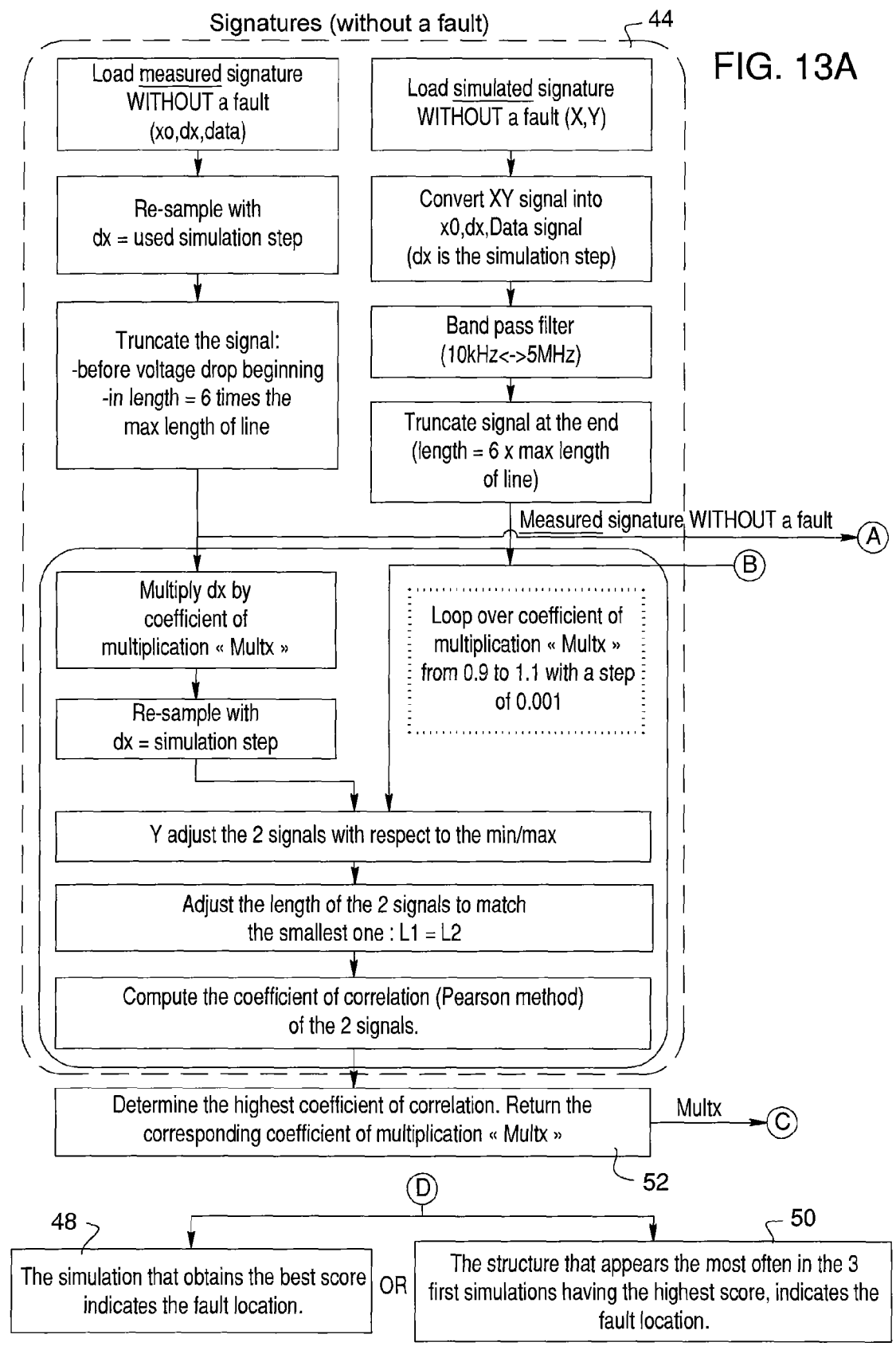
FIGS. 13A and 13B are schematic diagrams illustrating operations following the method according to the invention.
Figure 13B:
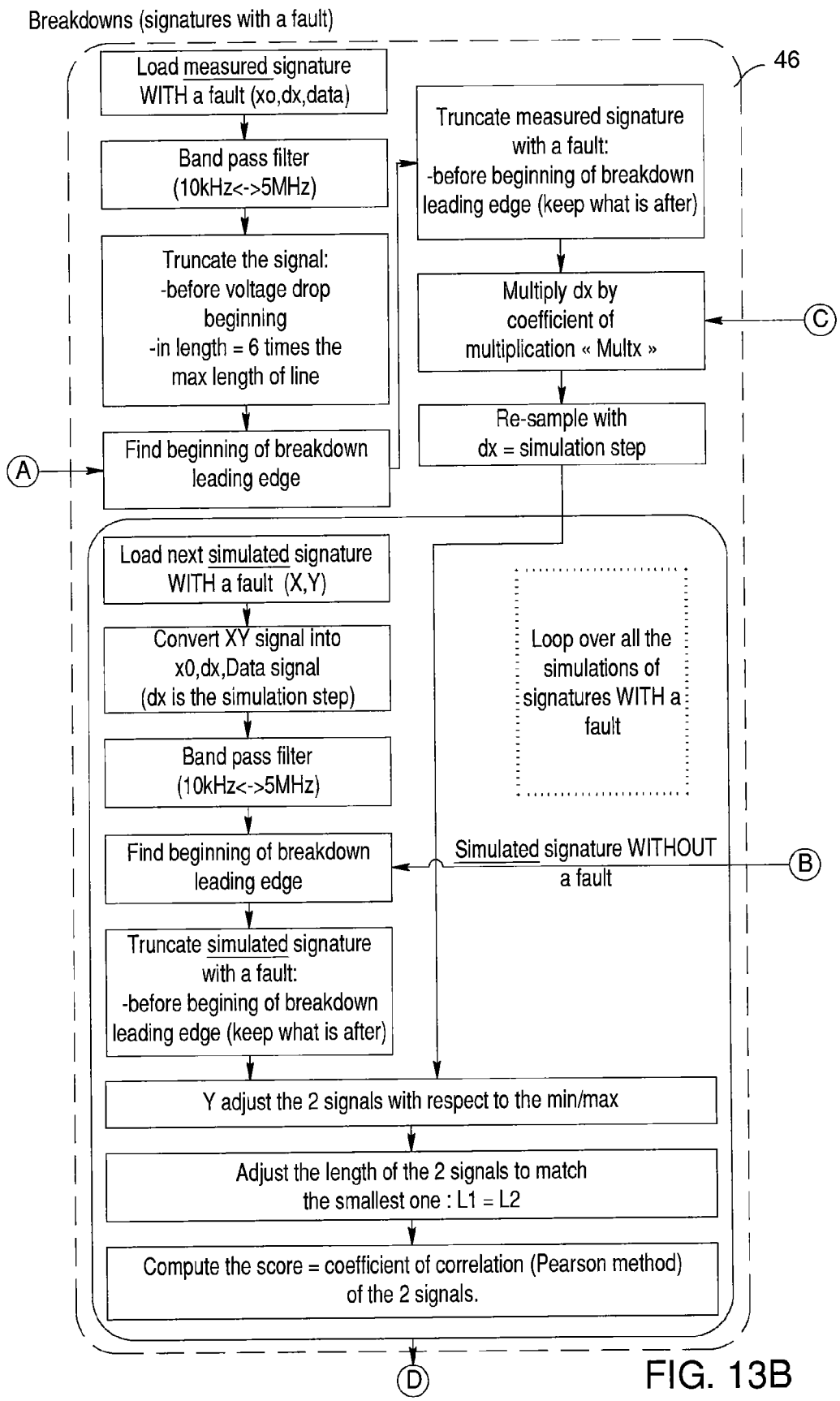

FIGS. 13A and 13B show an overview of operations carried out by the locating method according to the invention. The operations may be divided in a block 44 relating to the signatures without a fault and a block 46 relating to the signatures with a fault and producing an indication of the location of the fault based on the simulation that gets the best correlation score with the measured signal as depicted by block 48, or based on a structure (each simulation corresponds to a point on the line located between two clearly identified structures of the network) that appears the most often in the three simulations having the highest correlation score as depicted by block 50. Block 52 represents an indication of a multiplication coefficient in respect with a highest correlation between the measured and simulated signatures without a fault, used to adjust the measured signatures with a fault.

Efficient models for the elements entering into play in the measurement series of simulated signatures may be developed in different ways. The elements taken into account are preferably the voltage source and its cable, the medium voltage cables (or others if applicable), and the fault of a spark gap type (or other if applicable).

There is only one negligible effect on the measured voltage signal: the junctions. Each junction represents an impedance change in the signal propagation, but over a very short distance (in the order of 1 meter) compared to many hundreds of meters, or even kilometers, for the whole length of the tested line.

The simulation engine 19 (shown in FIG. 1) according to the invention is configured to simulate the electric behavior of the cables during the injection of the locating pulse. When the voltage pulse reaches the fault, the latter will breakdown, i.e. an electric arc will short the line during a short time period (for example from 4 to 200 μsec). The simulation of this phenomenon involves an appropriate model of the different types of cable likely to be installed in the network. The simulation engine 19 may be based on a fully programmed engine or an engine like the EMTP-RV ("ElectroMagnetic Transients Program"—trade name) from the company CEATI International Inc.

The model of the cables preferably takes into account the effects in frequency from 60 Hz to 10 MHz and the effects of the groundings that produce a current in the sheath (neutral) of a cable.

The high voltage pulse source may be installed in repair trucks and be made of a 4 µF capacitor, a relay and a 50 meter long cable. The values may vary if desired, as well as the installation.

Figure 14:
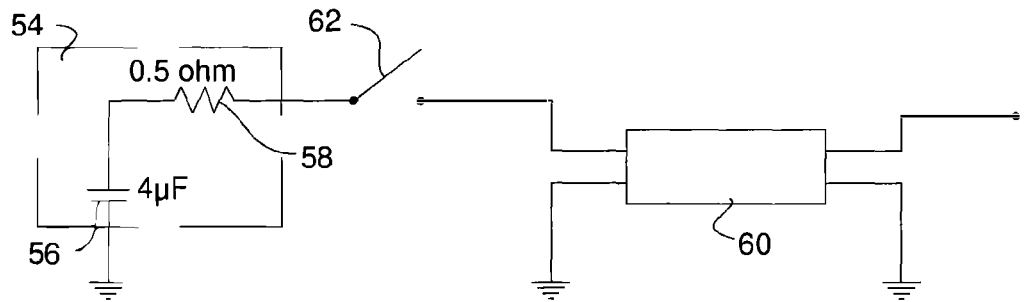
FIG. 14 is a schematic diagram illustrating a pulse source model for the simulations.

Referring to FIG. 14, the pulse source 54 may be modeled for the simulation by a 4 pF capacitor 56 connected to a 0.5 Ω is resistor 58 connected to a 50 meter cable 60 via a generally opened circuit breaker 62, which is closed to inject a pulse.

Figure 15:
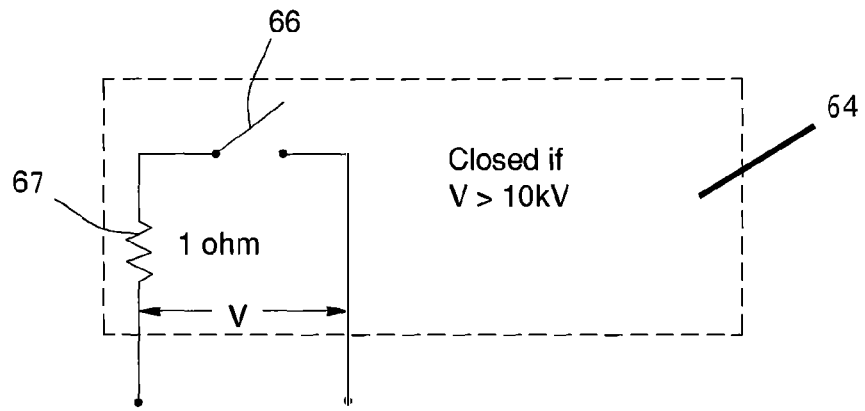
FIG. 15 is a schematic diagram illustrating a spark gap model for the simulations.

Referring to FIG. 15, the breakdown of the cable may be achieved using a spark gap model 64 similar to that which is integrated in the EMTP-RV simulation engine. The model 64 may then be made of a circuit breaker 66 and a resistor 67 responsive to a voltage level determined by the user, for example 10 kV. The resistor may be set at 1 Ω. The values may vary if desired. The circuit breaker 66 thus closes when the voltage across the modeled spark gap 64 is reached.

Figure 16:
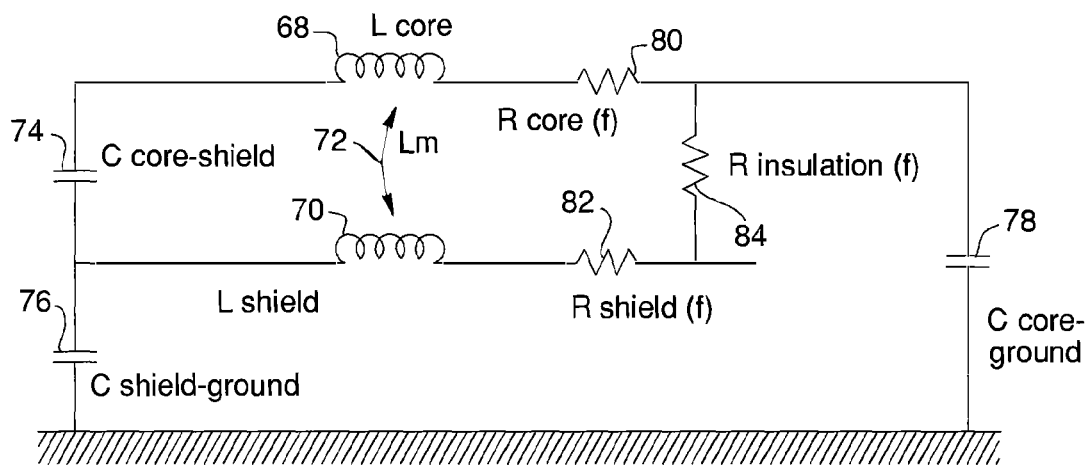
FIG. 16 is a schematic diagram illustrating a simplified cable model used to determine values of a model by section of discrete components for the simulations.

Referring to FIG. 16, an underground cable usually has a central conductor (the core) sheathed with a neutral made of about 24 conductors thereby forming a coaxial cable. The neutral wires are much spaced and do not allow creating a 100% efficient shielding. The magnetic field created by the core outside the neutral is not fully cancelled by the magnetic field of the neutral. Any current passing in a conductor creates a magnetic field. The inductance is defined by the ratio of the magnetic flux Ψ over the current I of a given circuit:

$$L = \frac{\Psi}{I}$$

Preferably, the line model takes into account the inductance 68 of the core, the inductance 70 of the neutral, and their mutual inductance 72 which represents the portion of the flux that cancels. The line model preferably also takes into account the linear capacitance 74 between the core and the neutral, the linear capacitance 76 between the neutral and the ground, the linear capacitance 78 between the core and the ground, the linear resistance 80, 82 of the core and of the neutral (this resistance changes as function of the frequency due to the skin effect), and losses 84 in the insulator, in particular at high frequencies.

Figure 17:
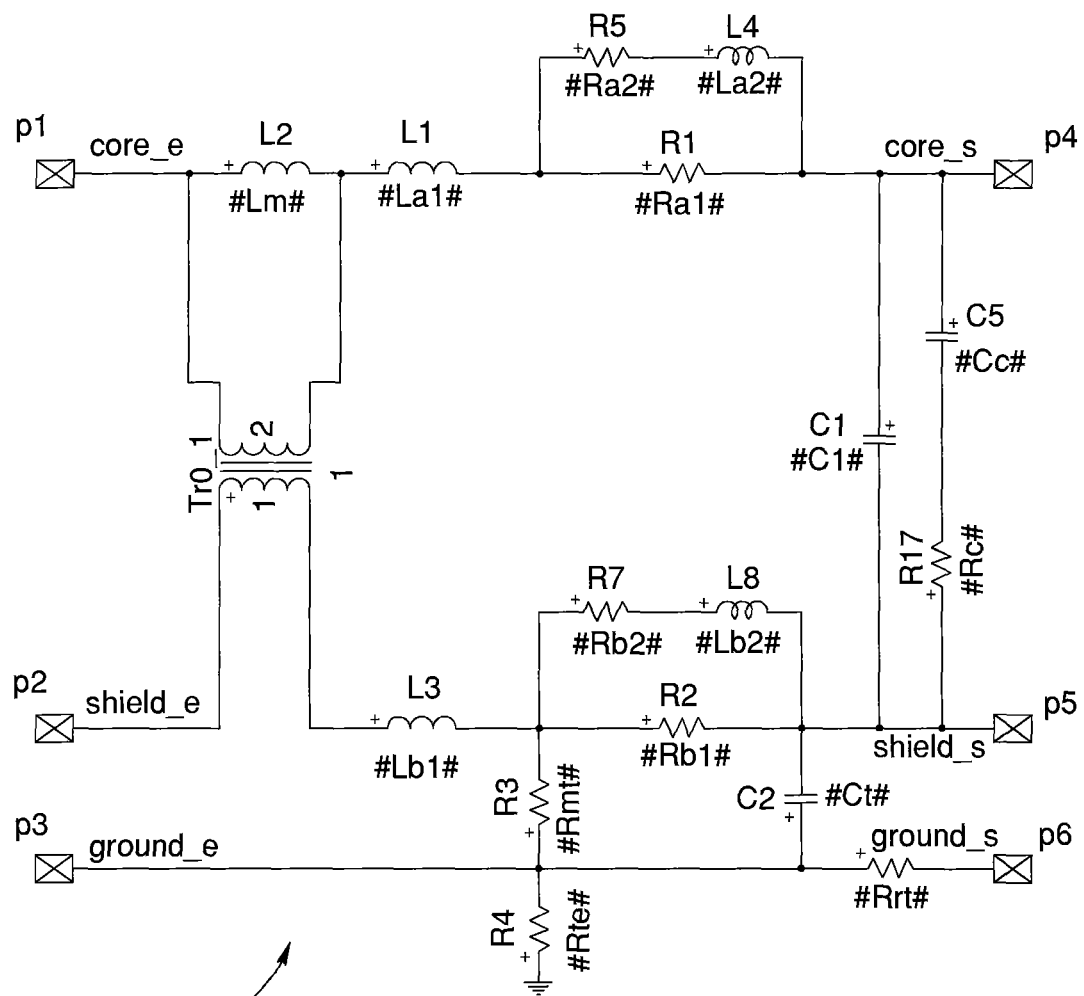
FIG. 17 is a schematic diagram illustrating a model by section of discrete components for the simulations.

Referring to FIG. 17, a model by section of discrete components 86, such as a pi model, has many interesting characteristics. It can be integrated into most of the electric or electronic circuit simulators, with all the conveniences related thereto. This type of model also has the advantage of being simple to use.

The model by section of discrete components may include the inductance of the core $L_{a1}$, the inductance of the neutral $L_b$, the core-neutral mutual inductance $L_m$, the core-neutral linear capacitance $C_l$, the neutral-ground linear capacitance $C_t$, the components modeling the linear resistance of the core with frequency correction $R_{a1}$, $R_{a2}$, $L_{a2}$, the components modeling the linear resistance of the neutral with frequency correction $Rb_1$, $Rb_2$, $L_{a2}$, and the components modeling the insulation loss linear resistance with frequency correction $R_c$, $C_c$.

A model of the ground and of the grounding may be incorporated in the model of the network. The ground model may be based on that proposed in the document EPRI TR-106661, V.1 ACE 249 D 904, "Mise à la terre des réseaux de distribution—Volume I: Manuel pratique", Août 1996, S. G. Patel, D. L. Garrett, A. P. Meliopoulos, with components $R_{mt}$, $R_{te}$, $R_{rt}$.

The values of the components of the simulation model (e.g. capacitances, inductances, etc.) may be determined in an empiric way or otherwise if desired. Several parameters of the simulation model may be as function of a length in meter of the modeled cable. The simulations may be carried out by concatenation of finite elements of one meter or of another distance, amounting to successively couple the blocks of discrete components to one another according to the configuration of the line section to be simulated.

Tables I, II and III below show values obtained for certain modeled cable ratings, where Cu represents copper, Al represents aluminum, Mono means single-phase and Tri means three-phase.

TABLE I

| 3/0 Al Mono | 3/0 Al Tri |
|---|---|
| Tr0_1 = 1 | Tr0_1 = 1 |
| Cl = 165E−12*L | Cl = 165E−12*L |
| Lm = 130E−9*L | Lm = 130E−9*L |
| La1 = 170E−9*L | La1 = 170E−9*L |
| La2 = 7E−9*L | La2 = 7E−9*L |
| Ra2 = 0.4480E−3*L | Ra2 = 0.4480E−3*L |
| Ra1 = (1/(1/(0.000442*L)-1/Ra2)) | Ra1 = (1/(1/(0.000442*L)-1/Ra2)) |
| Lb1 = 60E−9*L | Lb1 = 60E−9*L |
| Lb2 = 7E−9*L | Lb2 = 7E−9*L |
| Rb2 = 0.000940*L | Rb2 = 0.000940*L |
| Rb1 = 1/(1/(0.000900*L)-1/Rb2) | Rb1 = 1/(1/(0.000900*L)-1/Rb2) |
| Rrt = 50*L | Rrt = 50*L |
| Rte = 100000/L | Rte = 100000/L |
| Rmt = 1E12/L | Rmt = 1E12/L |
| Cc = 10E−12*L | Cc = 10E−12*L |
| Rc = 50000*L | Rc = 50000*L |
| Ct = 160E−12*L | Ct = 160E−12*L |

TABLE II

| 350 Al Tri | 350 Cu Tri |
|---|---|
| Tr0_1 = 1 | Tr0_1 = 1 |
| Cl = 215E−12*L | Cl = 215E−12*L |
| Lm = 70E−9*L | Lm = 70E−9*L |
| La1 = 124E−9*L | La1 = 124E−9*L |
| La2 = 3E−9*L | La2 = 3E−9*L |
| Ra2 = 0.210E−3*L | Ra2 = 0.210E−3*L |
| Ra1 = (1/(1/(0.000205*L)-1/Ra2)) | Ra1 = (1/(1/(0.000205*L)-1/Ra2)) |
| Lb1 = 50E−9*L | Lb1 = 50E−9*L |
| Lb2 = 3E−9*L | Lb2 = 3E−9*L |
| Rb2 = 0.000950*L | Rb2 = 0.000950*L |
| Rb1 = 1/(1/(0.000900*L)-1/Rb2) | Rb1 = 1/(1/(0.000900*L)-1/Rb2) |
| Rrt = 50*L | Rrt = 50*L |
| Rte = 100000/L | Rte = 100000/L |
| Rmt = 1E12/L | Rmt = 1E12/L |
| Cc = 10E−12*L | Cc = 10E−12*L |
| Rc = 50000*L | Rc = 50000*L |
| Ct = 160E−12*L | Ct = 160E−12*L |

TABLE III

| 500 Al Tri | 500 Cu Tri | 750 Al Tri |
|---|---|---|
| Tr0_1 = 1 | Tr0_1 = 1 | Tr0_1 = 1 |
| Cl = 240E−12*L | Cl = 240E−12*L | Cl = 280E−12*L |
| Lm = 78E−9*L | Lm = 78E−9*L | Lm = 19E−9*L |

TABLE III-continued

| 500 Al Tri | 500 Cu Tri | 750 Al Tri |
|---|---|---|
| La1 = 130E–9*L | La1 = 130E–9*L | La1 = 130E–9*L |
| La2 = 3E–9*L | La2 = 3E–9*L | La2 = 2E–9*L |
| Ra2 = 0.1437E–3*L | Ra2 = 0.1437E–3*L | Ra2 = 0.096E–3*L |
| Ra1 = (1/(1/(0.000143*L)–1/Ra2)) | Ra1 = (1/(1/(0.000143*L)–1/Ra2)) | Ra1 = (1/(1/(0.000095*L)–1/Ra2)) |
| Lb1 = 30E–9*L | Lb1 = 30E–9*L | Lb1 = 19E–9*L |
| Lb2 = 2E–9*L | Lb2 = 2E–9*L | Lb2 = 3E–9*L |
| Rb2 = 0.000960*L | Rb2 = 0.000960*L | Rb2 = 0.000615*L |
| Rb1 = 1/(1/(0.000900*L)–1/Rb2) | Rb1 = 1/(1/(0.000900*L)–1/Rb2) | Rb1 = 1/(1/(0.000600*L)–1/Rb2) |
| Rrt = 50*L | Rrt = 50*L | Rrt = 50*L |
| Rte = 100000/L | Rte = 100000/L | Rte = 100000/L |
| Rmt = 1E12/L | Rmt = 1E12/L | Rmt = 1E12/L |
| Cc = 10E–12*L | Cc = 10E–12*L | Cc = 10E–12*L |
| Rc = 50000*L | Rc = 50000*L | Rc = 50000*L |
| Ct = 160E–12*L | Ct = 160E–12*L | Ct = 160E–12*L |

The system and the method according to the invention, described above, work with a fault of a spark gap type produced by a pulse generator. The method may also apply to other types of faults (direct faults or open circuits) or with other types of generators (breakdown in service or with a direct current generator). To this effect, it is a matter of redefining the simulation models and the algorithms related to the comparison of the simulations and the measurements.

The method according to the invention may be carried out using a tangible computer program product containing instructions that, when executed by a processor e.g. of a computer, cause the processor to perform the steps of the method described above.

While embodiments of the invention have been illustrated in the accompanying drawings and described above, it will be evident to those skilled in the art that modifications may be made therein without departing from the invention.

The invention claimed is:

1. A method using a computer for locating a fault on a de-energized power line section, comprising the steps of:
    applying a voltage signal on the power line section in order to produce a reflection signal on the power line section characterizing the fault;
    measuring the reflection signal on the power line section produced in response to the voltage signal;
    the computer simulating, with a model of the power line section, an application of the voltage signal on the power line section and measurements of a plurality of reflection signals, each being produced in response to the voltage signal for a fault located at different locations along the power line section;
    the computer comparing the reflection signals simulated for the fault located at different locations with the measured reflection signal; and
    the computer indicating on a display connected there to a location of the fault on the power line section based on the location of the fault for the simulated reflection signal having a highest correlation with the measured reflection signal.

2. The method according to claim 1, further comprising the step of locating a position of a first leading edge in the measured reflection signal by processing of the measured reflection signal with respect to a reference reflection signal of the power line section without a fault, the simulated reflection signals being compared with the measured reflection signal in respect with the position of the first leading edge of breakdown.

3. The method according to claim 2, further comprising at least one of the steps of:
    measuring a reflection signal produced in response to a voltage signal applied on the power line section having a voltage level below a voltage level of the voltage signal producing the reflection signal characterizing the fault; and
    simulating, with the model of the power line section, a measurement of a reflection signal produced in response to a voltage signal applied on the power line section having a voltage level below a voltage level of the voltage signal producing the reflection signal characterizing the fault,
    the reference reflection signal being defined by at least one of the reflection signals thereby obtained.

4. The method according to claim 3, further comprising the step of determining a coefficient of correction applicable between the measured reflection signal and the simulated reflection signals based on a difference between the reference reflection signal obtained by measurement and the reference reflection signal obtained by simulation.

5. The method according to claim 4, wherein the coefficient of correction is applied to the measured reflection signal.

6. The method according to claim 1, wherein the steps of applying the voltage signal and of measuring the reflection signal are carried out at a same end of the power line section.

7. The method according to claim 1, wherein the different locations along the power line section are at regular distance intervals.

8. The method according to claim 1, wherein the model of the power line section comprises, for each cable rating in the power line section, core, neutral and mutual inductance values, core-neutral, neutral-ground and core-ground capacitance values, and core, neutral and cable insulation loss resistance values.

9. The method according to claim 8, wherein the model of the power line section comprises blocks of discrete components successively coupling to one another according to a configuration of the power line section to be simulated.

10. The method according to claim 1, wherein the voltage signal has a voltage level likely to cause a breakdown in the power line section.

11. The method according to claim 3, wherein the voltage level of the voltage signal to obtain the reference reflection signal is below 4 kV.

12. The method according to claim 2, wherein the processing comprises the steps of:
    applying a band pass filter to the measured reflection signal and to the reference reflection signal;
    carrying out a difference between the filtered reflection signals;
    carrying out a derivative of a curve resulting from the difference; and
    searching a first peak above a predetermined threshold in a curve resulting from the derivative, the first peak being indicative of the position of the first leading edge.

13. The method according to claim 12, wherein the processing further comprises the step of carrying out a windowing on the filtered reflection signals before carrying out the difference.

14. A system for locating a fault on a de-energized power line section, comprising:
    an interface that receives a measured reflection signal characterizing the fault and deriving from a voltage signal applied on the power line section;

a simulation engine simulating, with a model of the power line section, an application of the voltage signal on the power line section and measurements of a plurality of reflection signals, each being produced in response to the voltage signal for a fault located at different locations along the power line section;

a processor connecting to the interface;

a display connected to the processor;

a memory coupled to the processor, the memory storing instructions executable by the processor and that, when executed by the processor, cause the processor to:

compare the simulated reflection signals for the fault located at different locations with the measured reflection signal; and indicate on the display a location of the fault on the power line section based on the location of the fault for the simulated reflection signal having a highest correlation with the measured reflection signal.

15. The system according to claim 14, wherein the instructions comprise instructions causing the processor to find a position of a first leading edge in the measured reflection signal by processing of the measured reflection signal with respect to a reference reflection signal of the power line section without a fault, the simulated reflection signals being compared with the measured reflection signal in respect with the position of the first leading edge.

16. The system according to claim 15, wherein the instructions comprise instructions causing the processor to define the reference reflection signal by at least one of reflection signals obtained:

in response to a voltage signal applied on the power line section having a voltage level below a voltage level of the voltage signal producing the reflection signal characterizing the fault and received by the interface; and by simulation, with the model of the power line section, of a measurement of a reflection signal produced in response to a voltage signal applied on the power line section having a voltage level below the voltage level of the voltage signal producing the reflection signal characterizing the fault.

17. The system according to claim 16, wherein the instructions comprise instructions causing the processor to:

determine a coefficient of correction applicable between the measured reflection signal and the simulated reflection signals from a difference between the reference reflection signal obtained by measurement and the reference reflection signal obtained by simulation; and apply the coefficient of correction to the reflection signal measured in response to the voltage signal having the voltage level producing the reflection signal characterizing the fault.

18. The system according to claim 14, wherein the different locations along the power line section are at regular distance intervals.

19. The system according to claim 14, further comprising a topological database defining several power line sections, the model used by the simulation engine modeling the power line section on which the voltage signal has been applied and the measured reflection signal according to topological data corresponding to the power line section in the topological database.

20. The system according to claim 19, wherein the model of the power line section comprises, for each cable rating in the power line section, core, neutral and mutual inductance values, core-neutral, neutral-ground and core-ground capacitance values, and core, neutral and cable insulation loss resistance values.

21. The system according to claim 20, wherein the model of the power line section comprises blocks of discrete components successively coupling to one another according to a configuration of the power line section to be simulated.

22. The system according to claim 15, wherein the instructions comprise instructions related to the processing and causing the processor to:

apply a band pass filter to the measured reflection signal;

carry out a difference between the filtered reflection signal and the reference reflection signal;

carry out a derivative of a curve resulting from the difference; and search a first peak above a predetermined threshold in a curve resulting from the derivative, the first peak being indicative of the position of the leading edge.

23. The system according to claim 22, wherein the instructions related to the processing further comprise instructions causing the processor to carry out a windowing on the filtered reflection signal before carrying out the difference.

24. A tangible and non-transitory computer program product for locating a fault on a de-energized power line section, containing instructions that, when executed by a processor, causes the processor to perform the steps of:

receiving a measured reflection signal characterizing the fault and deriving from a voltage signal applied on the power line section;

simulating, with a model of the power line section, an application of the voltage signal on the power line section and measurements of a plurality of reflection signals, each being produced in response to the voltage signal for a fault located at different locations along the power line section;

comparing the reflection signals simulated for the fault located at different locations with the measured reflection signal; and indicating on a display coupled to the processor a location of the fault on the power line section based on the location of the fault for the simulated reflection signal having a highest correlation with the measured reflection signal.

* * * * *